United States Patent
Schaefer

(10) Patent No.: US 6,462,555 B1
(45) Date of Patent: Oct. 8, 2002

(54) APPARATUS FOR DETECTING A COMPLETED ELECTRICAL CIRCUIT, REVERSE POLARITY, GROUND AND GROUND FAULT INTERRUPTER

(76) Inventor: John S. Schaefer, 10617-B Lanshire Dr., Austin, TX (US) 78758

( * ) Notice: Subject to any disclaimer, the term of this patent is extended or adjusted under 35 U.S.C. 154(b) by 0 days.

(21) Appl. No.: 09/850,871

(22) Filed: May 7, 2001

(51) Int. Cl.[7] .............................................. G01R 31/00
(52) U.S. Cl. ..................................................... 324/508
(58) Field of Search ................................. 324/133, 508, 324/555, 556; 340/650, 651, 652, 654, 656

(56) References Cited

U.S. PATENT DOCUMENTS 3,851,243 A * 11/1974 Banner ......................... 324/51
3,908,286 A * 9/1975 Dean et al. .................. 35/19 A
4,164,702 A * 8/1979 Pereda ......................... 324/51

* cited by examiner

*Primary Examiner*—N. Le
*Assistant Examiner*—Etienne P LeRoux
(74) *Attorney, Agent, or Firm*—Rick Yeager

(57) ABSTRACT

A self-contained unit intended primarily for tracing the circuit connection between an electrical outlet or lighting receptacle and its corresponding circuit-breaker. The preferred embodiment includes a housing, a male three prong electrical plug, a sound-producing means, a first momentary switch which permits testing of a ground fault interrupt across either a hot wire and a neutral, or across a hot wire and the ground; and a second momentary switch which permits testing of reverse polarity by testing across a neutral and the ground. An alternate embodiment incorporates a single 3-way switch. Adapters are used to temporarily adapt bare wires or a lighting receptacle to a female plug so that the device may be used.

8 Claims, 5 Drawing Sheets

APPARATUS FOR DETECTING A COMPLETED ELECTRICAL CIRCUIT, REVERSE POLARITY, GROUND AND GROUND FAULT INTERRUPTER

FIELD OF THE INVENTION

The present invention relates generally to the testing of electrical receptacles and, more particularly, to determining whether an output receptacle, a light fixture, or bare wires are "live" and testing for power to ground and testing for reverse polarity.

DESCRIPTION OF THE PRIOR ART

U.S. patent application Ser. No. 09/332,481 filed Jun. 14, 1999 entitled "Apparatus for detecting a completed electrical circuit and testing an electrical output receptacle", by the inventor, describes electrical test devices including an embodiment with a button to test a ground and ground fault interrupt.

Other prior art includes devices for generating an audible signal when electricity is present in a circuit such as U.S. Pat. No. 5,331,283—entitled "Apparatus for detecting a completed electrical circuit at an electrical output receptacle" issued to Alan L. Sheldon on Jul. 19, 1994; and U.S. Pat. No. 4,725,772 entitled "Electrical circuit tester selectively responsive to either presence or absence of AC power" issued to Rex W. Peak on Feb. 16, 1988. The '283 patent summarizes other prior art.

It is frequently desirable to determine whether electrical power is present in an outlet, lighting receptacle, or loose wires. A test for the presence of electrical power is generally conducted before attempting work on the circuit. The usual method for removing power from a circuit is to turn off the circuit breaker for the appropriate circuit. Many situations arise which make it necessary to determine which circuit breaker is associated with a particular outlet. This identification can be a very time-consuming operation, especially when it must be performed by one person working alone. Frequently, the fuse box or circuit breakers are located at a considerable distance from the outlet of the circuit being traced, often on a different floor of the building. Many trips back and forth between the outlet and fuse/breaker box may be required before the proper circuit is identified.

For these reasons, it is desirable to have a simple, dependable audible test indicator that will provide a strong signal when power is present and which will not provide a signal when power is not present. It is also desirable for that test device to provide additional information about an electrical circuit including whether the circuit is wired with reverse polarity where the load is on the neutral rather than the hot leg.

SUMMARY OF THE INVENTION

The present invention, provides an electrical test buzzer adapted for insertion into an output receptacle and for testing for the presence of electricity at the output receptacle. The electrical test buzzer includes an audible alarm, and a pair of contact prongs which form a male electrical plug and a ground prong. The contact prongs and ground prong are inserted into an output receptacle, causing the buzzer to sound a loud alarm when electricity is present at the outlet or receptacle. When no electricity is present at the receptacle no circuit is formed and the alarm does not sound. The methods of using the electrical test buzzer device may include adapting the device to loose wires with alligator clips, and adapting the device to a lighting receptacle with an adapter. Methods for increasing the effective range of the device include using an extension cord between the receptacle and the device, and using a walkie/talkie or a baby monitor remote listening device.

A first ground button switch is provided to check for a voltage between either leg and the ground. A properly working Ground Fault Interrupt Circuit will trip when this button is pushed. A second reverse polarity switch is provided so that either the hot wire or the neutral wire may be tested to ground.

Variation in size, materials, shape, and use, are deemed readily apparent and obvious to those skilled in the art, and the invention is not limited to the specific embodiment described below. It will be obvious to those skilled in the art to substitute equivalent means for generating an audible signal and for adapting lighting receptacles and bare wires to the device.

DETAILED DESCRIPTION OF TWO BUTTON EMBODIMENT

Figure 2:
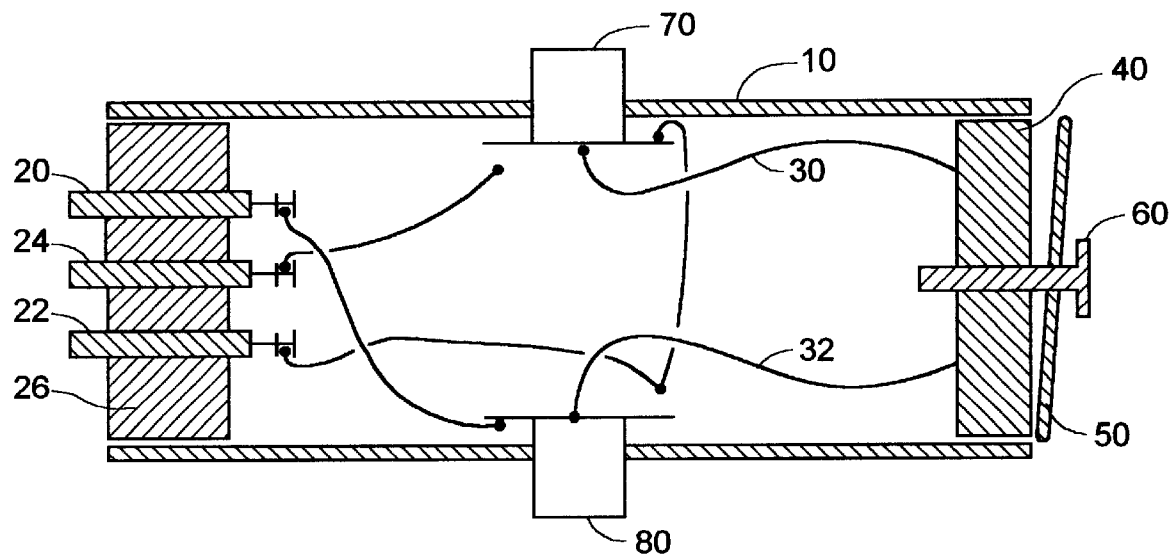
FIG. 2 is across section view of the device of FIG. 1.

Referring to FIG. 2 which is a cross sectional view of a two-button device, the device housing 10 is preferably a 1-inch PVC coupling. The housing contains a clapper assembly 40 with a first electrical lead 30 and a second electrical lead 32, such that the clapper makes an audible signal when a typical 110 volt differential is applied across the leads. The clapper disk 50 vibrates at a variable frequency as determined by the adjustment screw 60. The leads are connected to a three-prong plug assembly 26 which includes a first hot prong 20, a second neutral prong 22, and a ground prong 24. The prong assembly typically includes the prongs which are designed to be inserted into an electrical outlet; a plug housing, and a wire attachment means 28 for attaching electrical wires to the prongs. The wire attachment means is typically a screw assembly, but may be of equivalent functional design such as a wire insertion means or a wire solder design. The plug housing is preferably the same diameter as the inner diameter of the PVC coupling so that the plug housing fits snugly inside the coupling.

Figure 1:
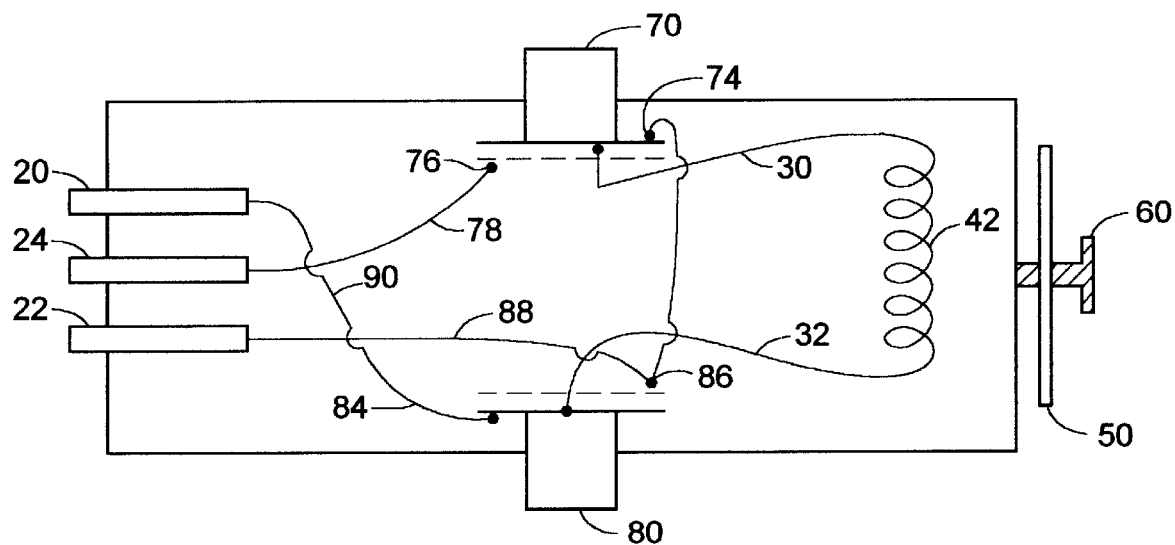
FIG. 1 is a schematic of a device with ground fault test button and reverse polarity test button.

Referring now to FIG. 1, which is an electrical schematic of the three-prong device with ground and polarity test buttons. The ground test button 70 is shown as a momentary switch having a first normally closed position 74 and second open position 76. The reverse polarity test button 80 is also shown as a momentary switch having a first normally closed position 84 and second open position 86.

When both the ground test button and the reverse polarity test button are in the normally closed position, 74 and 84 respectively, the first electrical connection of the audible signal means 30 is connected to neutral electrical prong 22, and the second electrical connection of the audible signal means 32 is connected to hot electrical prong 20. In a properly wired circuit, the buzzer will sound when the tester is inserted in the receptacle.

When the reverse polarity test button 80 is in the normally closed position 84 and the ground test button 70 is pushed to the open position 76, the first electrical connection of the audible signal means 30 is connected to the ground electrical prong 24, and the second electrical connection of the audible signal means 32 is connected to the hot prong 20. This connection provides a test for of proper functioning of the ground. A properly operating GFCI will trip when a connection is made between the hot lead and the ground. In the event that a ground fault interrupter is installed in the circuit, but not functioning properly, the clapper will emit a noise and vibration, which is an indication that there is a problem the ground fault interrupter. If there is no ground fault interrupter installed in the circuit, the device will emit a noise and vibration. If there is a ground fault interrupt in the circuit, the device will cause a good ground fault interrupt to trip.

The preferred method of installing the momentary switch is to drill a ½-inch hole in the device housing, and to place the switch to the inside of the shell. In the preferred method of construction, the switch is secured by the epoxy fill material. Alternately, the switch may be secured to the housing by screws or other attachment means.

When the reverse polarity test button pushed to in the open position 86 and the ground test button is pushed to the open position 76, the first electrical connection of the audible signal means 30 is connected to the ground prong 24, and the second electrical connection of the audible signal means 32 is connected to the neutral prong 22, thereby providing a test for reverse polarity. In this embodiment, these switch positions correspond to both the ground test button 70 and the reverse polarity test button 80 being pushed at the same time. In the event that the neutral wire is carrying a load, this connection will provide a test between the neutral and the ground, and the clapper will vibrate if polarity is reversed.

When the ground test button is depressed to its open position, the first switch contact 74 is disengaged, and a second switch contact 76 is engaged. When the reverse polarity test button is depressed to its open position, the first switch contact 84 is disengaged, and a second switch contact 86 is engaged.

The device is assembled by securing the first electrical connection of the audible signal means 30 to the ground test button 70, and securing the second electrical connection of the audible signal means 32 to the reverse polarity test button 80 A lead wire or other type of electrical connection such as a circuit board circuit is made between the hot wire prong 20 and the normally closed position 84 of the reverse polarity test button. A lead wire or other type of electrical connection such as a circuit board circuit is made between the ground wire prong 24 and the normally open position 76 of the ground test button. A lead wire or other type of electrical connection such as a circuit board circuit is made between the neutral wire prong 22 and both the normally open position 86 of the reverse polarity test button and the normally closed position 74 of the ground test button.

It is desirable to cut the excess lead wires so that only about 3–4 inches of wire extends from the coupling when the clapper housing is inserted. This length provides sufficient lead wire to make the attachment to the plug assembly.

After the lead wires of the clapper assembly are connected to the plug assembly, the plug assembly is inserted into the coupling so that the plug housing is approximately flush with the end of the coupling. The device is then inverted so that the plug assembly is on the bottom, and a two-part epoxy 90 is then added to displace the remaining air volume within the shell. This epoxy may be pre-mixed, or it is possible to add the two components of the epoxy, and to mix the epoxy in place, inside the coupling. As the epoxy hardens, the epoxy provides electrical insulation and mechanical reinforcement to secure the plug assembly and the clapper assembly inside of the device housing.

When the prongs are inserted into an electrical outlet, a current flows through the prongs and through the leads to the clapper coil 42, thereby causing the clapper disk 50 to vibrate. The noise or vibration generated by the clapper can be regulated by the audible adjusting screw 60. The preferred clapper assembly is an Edwards 120 vote 50–60 Hz and buzzer with leads, catalog No. 1066.

Figure 3:
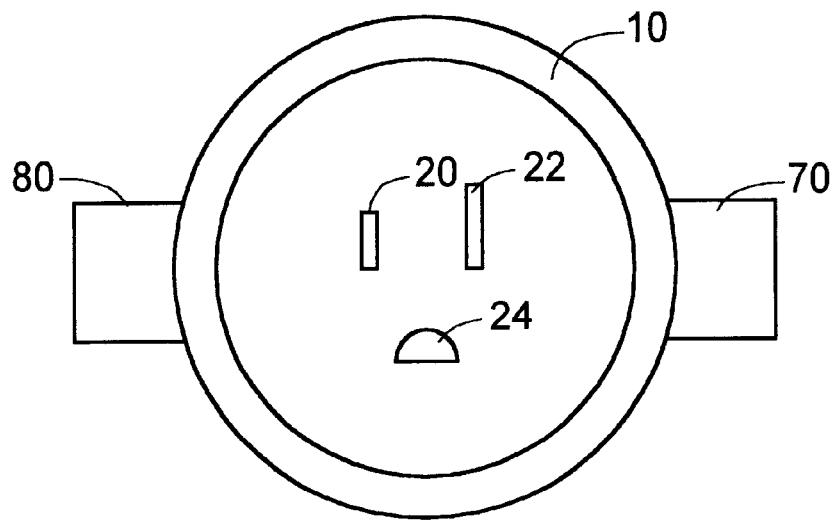
FIG. 3 is a frontview of the device of FIG. 2.

Referring now to FIG. 3, which is an end view of the device, the hot prong 20, the neutral prong 22, the ground prong 24, the ground test button 70, and the reverse polarity test button 80 are shown in relation to the housing 10.

The preferred method of operating the device is to plug the device into an electrical outlet or receptacle, and then to locate the proper circuit which causes the power to stop buzzing or vibrating. This identification is typically performed by turning off one circuit breaker at a time and then listening for the clapper noise. Once the circuit is identified, the power should be turned on momentarily to verify that the sound is restored, and then turned off again to verify that the sound is not present. Before work is begun on the circuit, the outlet, receptacle, or wiring may be checked with another circuit tester. In the event that the electrical box is located in a position that makes it difficult to hear the clapper noise, it is possible to use a walkie-talkie or a baby monitor as a listening device. An alternative is to use an extension cord between the device and the outlet or receptacle so that the device may be placed within earshot of the circuit box.

The device may be used to test lighting outlets through the use of screw-in lamp threaded receptacle adapter which includes a female electrical receptacle and a male lighting adapter. When the adapter is screwed into a lighting socket, and the device is plugged into the electrical receptacle, the device will function in a manner similar to its wall plug embodiment. The clapper will generate noise and vibration when electricity is present at the lighting socket.

The device may also be used to test bare circuit wires through the use of a standard pigtail or alligator clip adapter which includes a female electrical receptacle and wire leads with alligator clips. The preferred adapter provides both a screw-in adapter and wire leads. When the adapter is clipped to live conductors, and the device is plugged into the electrical receptacle, the device will function in a manner similar to its wall plug embodiment. The clapper will generate noise and vibration when a voltage is present across the conductors.

Figure 4:
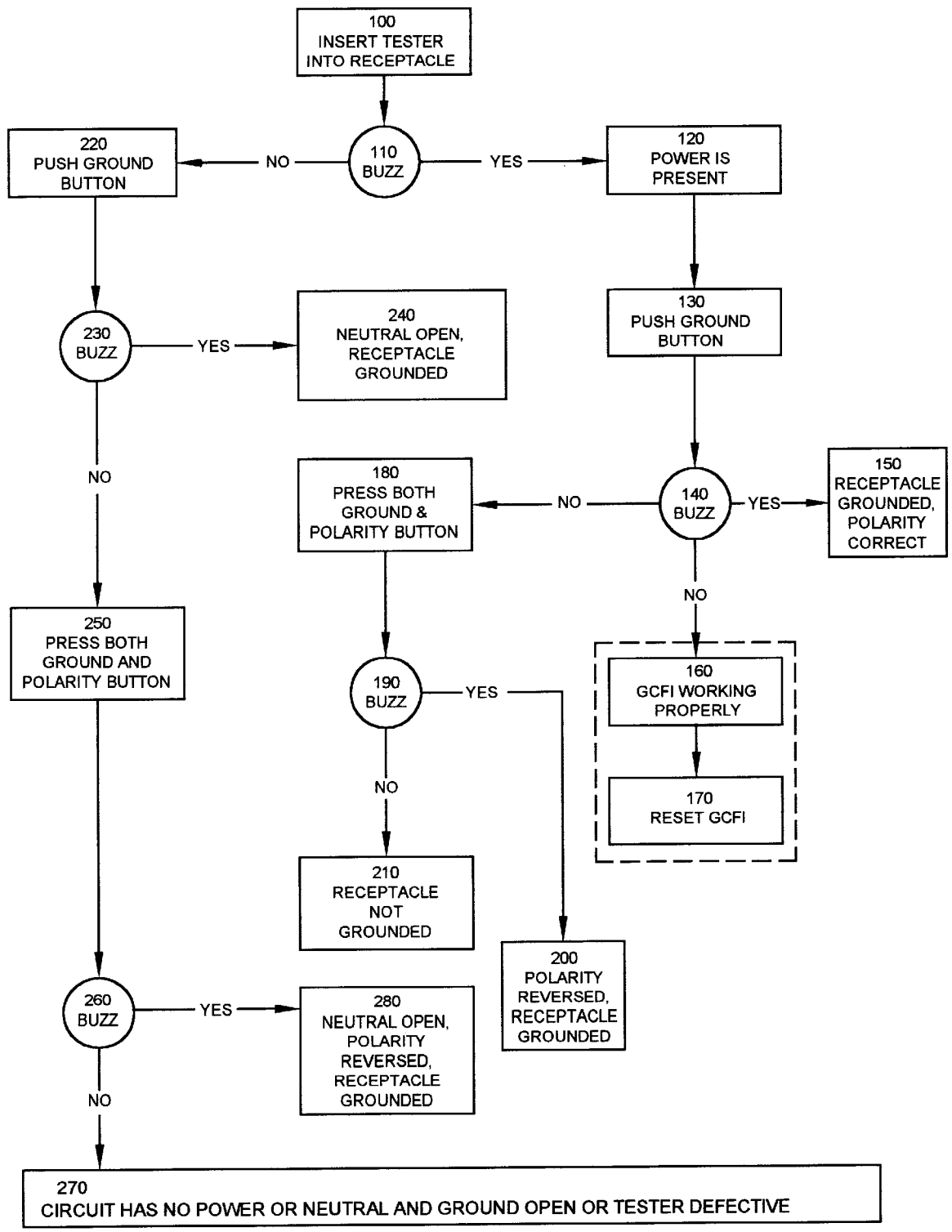
FIG. 4 is a flow chart of a test procedure using the device of FIG. 1.

Referring now to FIG. 4, which is a flow chart of a test procedure using the device, the tester is inserted into a receptacle at step 100. Alternately, an adapter may be used to connect the tester to the circuit. The following conditions may be determined by the tester:

Step 150—Power is Present, the Receptacle is Grounded, and the Polarity is Correct If the buzzer sounds at step 120, then power is present. In this case, when the ground test button is pressed at step 130, and the buzzer sounds at step 140, then power is present, the receptacle is grounded, and the polarity is correct at step 150.

Step 160—Power is Present, A GFCI is Working Properly

When a GFCI is installed on the circuit, and the buzzer does not sound at step 140 when the ground test button is pressed at step 130, then the GFCI is working properly.

Step 210—Power is Present, the Receptacle is not Grounded

If there is no GFCI on the circuit, a test for ground may be made by pressing both the ground test button and the polarity test button at step 180. If the buzzer does not sound at step 190, then the receptacle is not grounded at step 210.

Step 230—Power is Present, the Neutral is Open, the Receptacle is Grounded

When the buzzer does not sound at step 110, the ground test button is pressed at step 220. If the buzzer sounds at step 230, then power is present, the neutral is open, the receptacle is grounded at step 240.

Step 200—Power is Present, the Polarity is Reversed, and the Receptacle is Grounded If the buzzer does not sound at step 230, both the ground button and the polarity button are pushed at step 250. If the buzzer sounds at step 260, then power is present, the polarity is reversed, and the receptacle is grounded at step 200.

Step 270—The Circuit May Not Have Power

If the buzzer does not sound at step 260, then there are several possibilities at step 270, including that the circuit may not have power; both the neutral and the ground may be open; or the tester may be defective.

The preferred three-prong plug is a Leviton three prong No. 1515, 120-volt plug. It may be necessary clip the leads of the plug before inserting the plug into the coupling. The preferred switches are No. 2 G. C. S/P DT momentary switch, catalog No. 35–416. It is generally desirable to remove the lock nut from the switch when using epoxy fill in order to simplify the assembly. The preferred epoxy is a clear quick set two-part mixture. For low production volume, it is possible to mix equal portions of the epoxy components within the shell internal area, so as to minimize waste of the epoxy. The preferred clapper assembly is an Edwards 120 vote 50–60 Hz and buzzer with leads, catalog No. 1066.

The housing is preferably marked with a "G" in the vicinity of the ground test button, and with a "P" in the vicinity of the reverse polarity test button.

DETAILED DESCRIPTION OF THREE-POSITION SWITCH EMBODIMENT

Figure 5A:
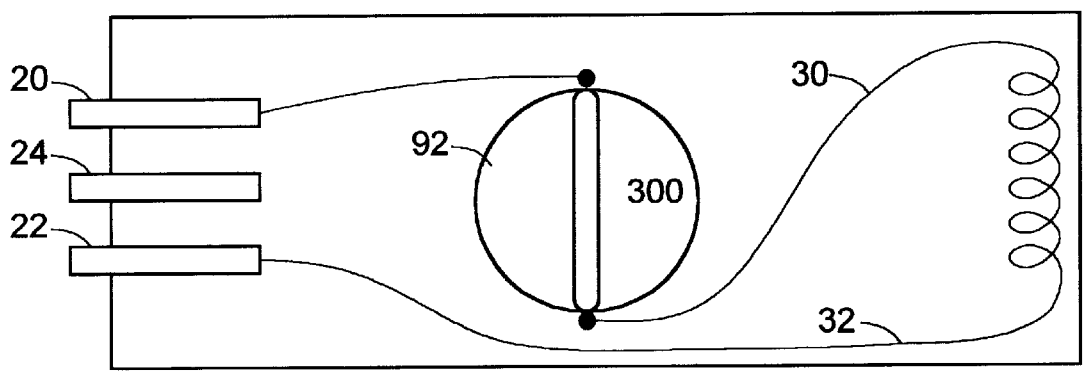
FIG. 5A is a schematic of a device with a three position switch in a first position
Figure 5B:
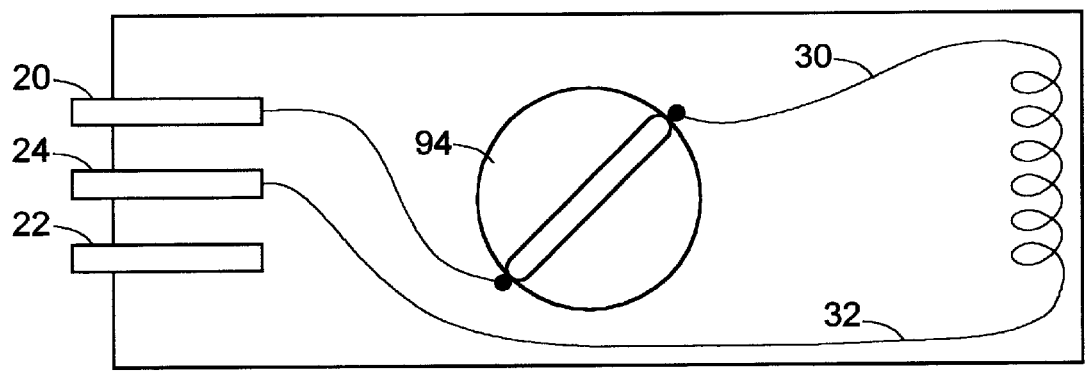
FIG. 5B is a schematic of a device with a three position switch in a second position
Figure 5C:
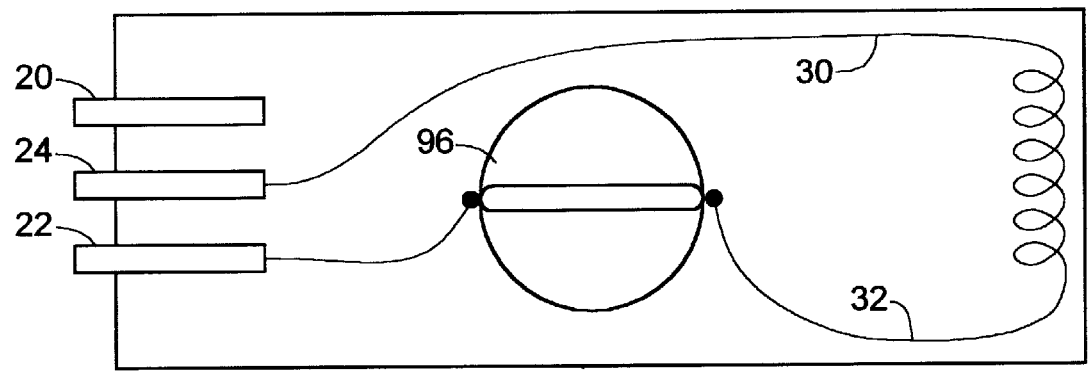
FIG. 5C is a schematic of a device with a three position switch in a third position

Referring now to FIGS. 5A–5C, the ground test button and the reverse polarity test button may be replaced by a single three position switch 300 where the first switch position 92 corresponds to both buttons in a normally closed position; the second switch position 94 corresponds to the reverse polarity test button in the normally closed position and the ground test button is in the open position; and the third switch position 96 corresponds to the reverse polarity test button in the open position and the ground test button is in the open position. A rotary switch is shown in the figure. Alternatively, a slide or other type of switch may be used.

Referring to FIG. 5A, when the switch is in the first position 92, the first electrical connection of the audible signal means 30 is connected to hot electrical prong 20, and the second electrical connection of the audible signal means 32 is connected to neutral electrical prong 22. In a properly wired circuit, the buzzer will sound when the tester is inserted in the receptacle.

Referring to FIG. 5B, when the switch is in the second position, the first electrical connection of the audible signal means 30 is connected to the hot electrical prong 20, and the second electrical connection of the audible signal means 32 is connected to the ground prong 24. This connection provides a test for of proper functioning of a ground and of a GFCI as described in the embodiment above.

Referring to FIG. 5C, when the switch is in the second position, the first electrical connection of the audible signal means 30 is connected to the ground electrical prong 24, and the second electrical connection of the audible signal means 32 is connected to the neutral prong 22, thereby providing a test for reverse polarity. These switch positions correspond to both the ground test button and the reverse polarity test button being pushed at the same time in the embodiment described above. This connection will provide a test between the neutral and the ground.

What is claimed is:

1. An electrical circuit tester for temporary connection across a group of conductors to determine whether AC power is present, the tester comprising:

a housing;

the electrical prong assembly, integral to the housing, having a first electrical prong, a second electrical prong, and a third electrical prong such that the first electrical prong is associated with the hot wire of a single phase electrical circuit, the second electrical prong is associated with the neutral wire of a single phase electrical circuit, and the third electrical prong is associated with the ground wire of a single phase electrical circuit;

an electrically-activated audible signal means, integral to the housing, having a first electrical connection and a second electrical connection such that the audible signal means is activated when electric current flows between the first electrical connection and the second electrical connection;

a first switching means, integral to the housing, having a first switch first position and a first switch second position; and a second switching means, integral to the housing, having a second switch first position and a second switch second position, such that when the second switch is in the second switch first position and the first switch is in the first switch first position, the first electrical connection of the audible signal means is connected to the second electrical prong, and the second electrical connection of the audible signal means is connected to the first electrical prong, and when the second switch is in the second switch first position and the first switch is in the first switch second position, the first electrical connection of the audible signal means is connected to the third electrical prong, and the second electrical connection of the audible signal means is connected to the first electrical prong, and when the second switch is in the second switch second position and the first switch is in the first switch second position, the first electrical connection of the audible signal means is connected to the third electrical prong, and the second electrical connection of the audible signal means is connected to the second electrical prong, thereby providing a test for reverse polarity.

2. The electrical circuit tester of claim 1 wherein the electrically-activated audible signal means is a clapper.

3. The electrical circuit tester of claim 1 wherein there is an adjusting means, such that the adjusting means may raise or lower the volume of the electrically-activated audible signal means.

4. The electrical circuit tester of claim 1 wherein the housing is substantially filled with an electrically insulating epoxy.

5. An electrical circuit tester for temporary connection across a group of conductors to determine whether AC power is present, the tester comprising:

a housing;

the electrical prong assembly, integral to the housing, having a first electrical prong, a second electrical prong, and a third electrical prong such that the first electrical prong is associated with the hot wire of a single phase electrical circuit, the second electrical prong is associated with the neutral wire of a single phase electrical circuit, and the third electrical prong is associated with the ground wire of a single phase electrical circuit; an electrically-activated audible signal means, integral to the housing, having a first electrical connection and a second electrical connection such that the audible signal means is activated when electric current flows between the first electrical connection and the second electrical connection;

a switching means integral to the housing, the switching means having at least a first switch position, a second switch position, and a third switch position, such that in the first switch position, the first electrical connection of the audible signal means is connected to the second electrical prong, and the second electrical connection of the audible signal means is connected to the first electrical prong, and in the second switch position, the first electrical connection of the audible signal means is connected to the second electrical prong, and the second electrical connection of the audible signal means is connected to the first electrical prong, and in the third switch position, the first electrical connection of the audible signal means is connected to the third electrical prong, and the second electrical connection of the audible signal means is connected to the second electrical prong, thereby providing a test for reverse polarity.

6. The electrical circuit tester of claim 5 wherein the electrically-activated audible signal means is a clapper.

7. The electrical circuit tester of claim 5 wherein there is an adjusting means, such that the adjusting means may raise or lower the volume of the electrically-activated audible signal means.

8. The electrical circuit tester of claim 5 wherein the housing is substantially filled with an electrically insulating epoxy.

* * * * *